United States Patent [19]

Straccia, Sr. et al.

[11] Patent Number: 4,607,751

[45] Date of Patent: Aug. 26, 1986

[54] ANTIVIBRATION GUIDES FOR SECURING PRINTED CIRCUIT CARDS

[75] Inventors: William J. Straccia, Sr., Allentown, Pa.; Dale L. Smous, Coral Springs, Fla.

[73] Assignee: Electro-Space Fabricators, Inc., Topton, Pa.

[21] Appl. No.: 721,860

[22] Filed: Apr. 8, 1985

[51] Int. Cl.⁴ .............................................. A47G 19/08
[52] U.S. Cl. ..................................... 211/41; 361/416; 339/17 LM
[58] Field of Search ................... 211/41, 40; 361/416, 361/415; 339/17 LM

[56] References Cited

U.S. PATENT DOCUMENTS

| | | | |
|---|---|---|---|
| 3,231,785 | 1/1966 | Calabro | 339/17 LM |
| 3,696,936 | 10/1972 | Straccia et al. | 211/41 |
| 3,762,574 | 10/1973 | Bentley et al. | 211/41 |
| 3,899,721 | 8/1975 | Borchard et al. | 361/415 |
| 4,007,403 | 2/1977 | Fiege | 211/41 X |
| 4,323,161 | 4/1982 | Marconi | 211/41 |
| 4,335,819 | 6/1982 | Weisman et al. | 211/41 |

Primary Examiner—J. Franklin Foss
Assistant Examiner—Sarah A. Lechok Eley
Attorney, Agent, or Firm—Ronald B. Sherer

[57] ABSTRACT

An antivibration guide is disclosed for use in removably mounting printed circuit cards in metal racks. The guide is composed of plastic, having a U-shaped cross section for receiving and holding the P.C. card; and the guide includes at least a pair of vibration dampening buffers. Each buffer includes a pair of vibration dampeners, located on opposite sides of the P.C. card, with each dampener including: a pair of flexible legs connected to the side walls of the guide, and further including a midportion having a pair of vibration dampening surfaces which engage the side edges of the P.C. card and reduce the vibration of the P.C. card.

8 Claims, 3 Drawing Figures

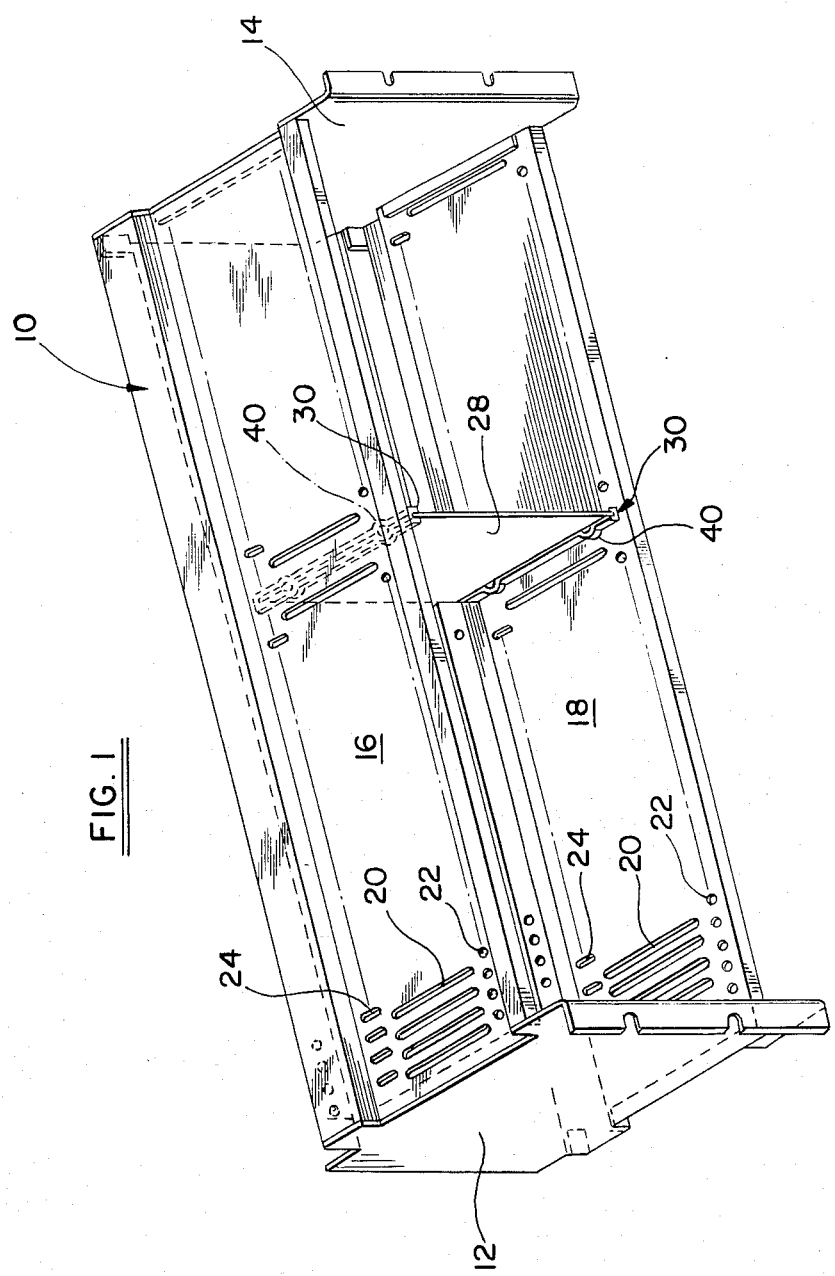

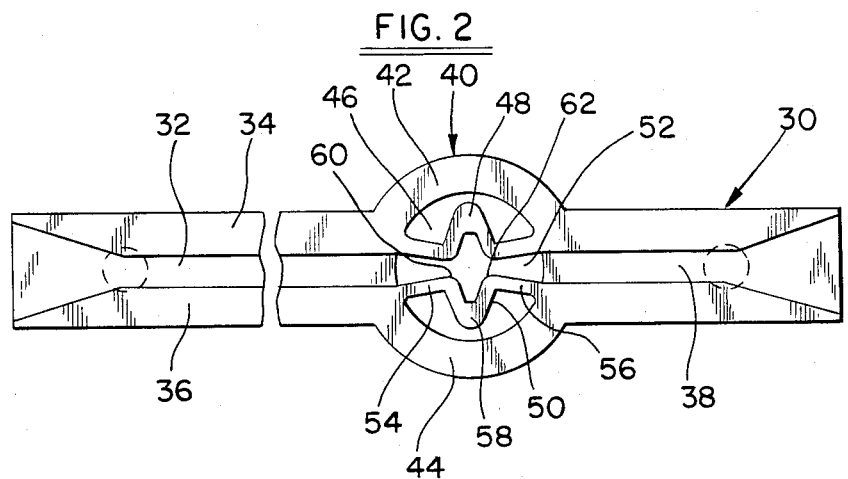
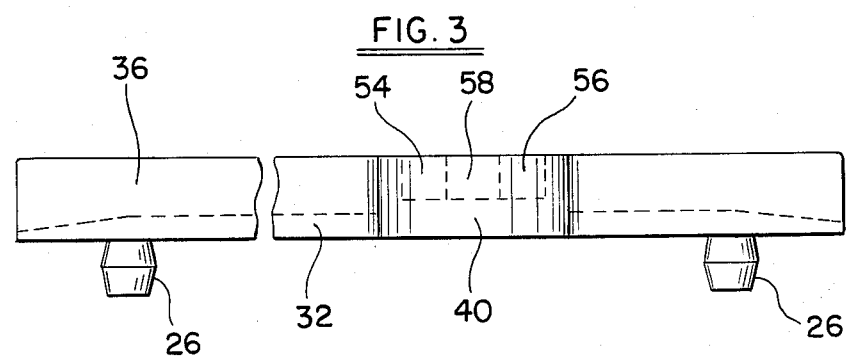

ANTIVIBRATION GUIDES FOR SECURING PRINTED CIRCUIT CARDS

BACKGROUND OF THE INVENTION

In the art of manufacturing and using metal racks for securing a plurality of printed circuit (P.C.) boards or cards, it is well known to use replaceable, plastic channels or guides to facilitate the insertion, retention and withdrawal of the P.C. cards into and out of the rack. The main purpose of the plastic guides is to mechanically hold the P.C. cards in the rack during transportation and in use, particularly where the rack may be tilted as in aerospace applications, and plastic guides are used in place of integral metal channels formed in the rack whenever abrasion or contact of the electronic components might otherwise occur. One example of such plastic guides is described in U.S. Pat. No. 3,696,936 wherein the guides are bowed so as to exert positive frictional engagement with the edges of the P.C. cards and thereby increase their ability to retain the cards securely in place despite manufacturing tolerances in both the cards and the racks.

In addition to physically holding the cards in the rack, in certain applications the cards may be subjected to high vibration forces such that it is necessary to dampen the vibration of the cards lest the printed circuits be broken. To this end, a number of prior guides have been designed in various attempts to dampen vibrations of the card by including a plurality of flexible extensions, or "fingers", which engage the card at a plurality of points. For example, one of such P.C. card guides is described in U.S. Pat. No. 3,231,785, wherein pairs of flexible fingers are designed to engage the side edges of the cards to dampen the vibrations. However, since such fingers are only connected to the guide at one end, the unconnected end of the finger is itself free to vibrate at its own resonance frequency, and is also subject to being broken upon insertion of a card from the wrong end. Another problem that most prior guides having antivibration dampeners have had is that they have to be wider than those without dampeners, and the cost of such guides has been relatively high.

SUMMARY OF THE INVENTION

The present invention provides a plastic guide for P.C. cards which, in addition to the conventional side walls of the guide forming the U-shaped channel, also provides a plurality of vibration dampeners which are spaced apart by a distance less than that between the side walls, and in which each dampener includes a pair of leg portions connected to the side walls, and free midportions which engage the P.C. cards. In the preferred embodiment, the midportions are shaped such that each midportion includes a pair of contact surfaces engaging one side edge of the P.C. card.

A BRIEF DESCRIPTION OF THE DRAWINGS

FIG. 1 is a perspective view of a card rack showing a printed circuit card held by a pair of card guides.
FIG. 2 is a top, plan view of the card guide.
FIG. 3 is a side, elevational view of the card guide.

DETAILED DESCRIPTION OF THE PREFERRED EMBODIMENT

Referring to FIG. 1, numeral 10 represents a typical printed circuit card enclosure, or card rack, which comprises a pair of end plates 12, 14 which are secured to and support a pair of horizontal shelf members 16 and 18. Shelf members 16 and 18 preferably include a plurality of elongated vent slots 20, and they are provided with pairs of apertures 22, 24 which may be pairs of round holes and/or slightly elongated slots, and which are of a precise size such as to receive and secure the snap projections 26 of a plurality of card guides 30. The further construction details of the card rack 10 are not essential to the improved card guides 30 of the present invention, and it will subsequently become apparent that the improved card guides 30 may be used with card racks of widely different forms. However, for purposes of completeness, reference may be made to the details of the card rack disclosed in U.S. Pat. No. 3,696,936, which is hereby incorporated by reference, as one example of a rack which may be used with the card guides 30 of the present invention.

Referring to FIGS. 2 and 3, card guides 30 are preferably molded of a polymeric material such as nylon, teflon or other polymers collectively referred to hereinafter as plastic materials. Each of guides 30 includes elongated, flat base portion 32 and a pair of vertical sides 34, 36 which collectively form a U-shaped channel 38 for receiving and holding a P.C. card, such as card 28 shown in FIG. 1. As previously indicated, each of guides 30 preferably includes a pair of snap-projections 26 which are snapped into pairs of apertures 22, 24 in shelf members 16, 18. However, it will be apparent that card guides 30 may be secured in other forms of card racks by other well-known fastening means, such as clips or various interengaging members, all of which types of securing devices are hereinafter referred to as fastening members.

Again referring to FIGS. 2 and 3, each of the card guides 30 includes at least a pair of antivibration buffers 40. Buffers 40 are formed by diverging portions 42, 44 of side walls 34, 36 such that the diverging side wall portions 42, 44 form a widened space 46 extending around and on either side of the U-shaped channel 38. Within space 46, a pair of flexible antivibration dampeners 48, 50 are provided such that they form a tapered and restricted channel portion 52 which is smaller in width than the width of the U-shaped channel 38. In the preferred embodiment of the invention, dampeners 48 and 50 are formed as integral, molded portions of the card guide, and as such, they constitute thinned portions or extensions of the walls 42, 44 so that they are substantially more flexible than the main portions of the walls forming the U-shaped channel 38. However, the dampeners 48, 50 are substantially strengthened by their specific design shape which is generally that of a flattened W-shape. That is, each of dampeners 48, 50 comprise leg portions 54, 56 joined to walls 34, 36 and a central, V-shaped midportion 58, the latter of which forms a pair of contact surfaces 60, 62 which engage the sides of the P.C. cards. Thus, each pair of dampeners 48, 50 comprise two V-shaped portions 58 on opposite sides of the P.C. card whereby the card is engaged by a total of four contact surfaces. As a result, each P.C. card is engaged by four dampening surfaces in each buffer 40, and at least a pair of buffers is provided in each guide a short distance inwardly from each end. For longer guides, a third buffer 40 may be provided in the center portion of the card guide in order to further increase the number of dampening surfaces engaging the card.

In order to decrease the effective width of the guides when a plurality of guides are arranged side-by-side in a rack, the positions of the enlarged buffers may be varied along the length of adjacent guides so that the buffers of adjacent guides are staggered or stacked relative to each other. For example, some guides may be manufactured with their buffers closer to the end of the guides and others with their buffers farther from the ends of the guide. In this manner, alternate guides in a rack may be selected so as to have their buffers in different positions relative to each other and thereby achieve a much closer spacing of the guides in a rack of given size.

From the foregoing description it will be apparent that each card guide of the present invention provides multiple antivibration dampening surfaces, which coact in balanced pairs on opposite sides of the cards, and which are not subject to being easily broken as the P.C. card is inserted, or even if the rack and cards are subjected to unusually high degrees of vibration. They also provide a maximum degree of dampening since they do not have free ends engaging the P.C. cards, but rather, the ends are integral with the side walls of the guide and the resilience of the V-shaped midportions may be easily controlled by selecting the desired thickness of leg and midportions. For example, excellent results have been obtained with nylon guides having dampeners 48, 50 with a nominal thickness of 0.025 inches or other thicknesses which are much thinner than the thickness of the channel walls 34, 36. Thus, the walls 34, 36 including the diverging, rounded portions 42, 44 provide structural strength and integrity of the plastic guide, and the rounded portions 42, 44 also surround and protect the much thinner dampeners 48, 50 so that the latter are protected from breakage during both shipment and in use in the card guides.

Having fully described one preferred embodiment of the invention, it will be apparent that numerous variations will be apparent to those skilled in the art such that the invention is not intended to be limited other than as expressly set forth in the following claims.

What is claimed is:

1. A card guide for securing P.C. cards in a card rack comprising, an elongated guide composed of plastic material having an elongated base portion and a pair of vertical side walls defining a U-shaped channel, said U-shaped channel being of uniform width and extending substantially the full length of said guide, said side walls having diverging wall portions forming at least two antivibration buffers with enlarged spaces formed between said diverging wall portions, the outer widths of said diverging wall portions being substantially wider than the outer width of the portions of the side walls forming said U-shaped channel, and the width of each of said enlarged spaces being substantially greater than the uniform width of said U-shaped channel, a pair of vibration dampeners within each of said enlarged spaces, each of said dampeners having card-engaging surfaces spaced apart by a distance less than the uniform width of the U-shaped channel.

2. The card guide as claimed in claim 1 in which each of said vibration dampeners comprises a flexible member having a pair of leg portions and a midportion, each of said leg portions having first and second end portions, each of said first end portions being integral with one of said side walls and each of said second end portions being integral with said midportion, and said midportion having said card-engaging surfaces.

3. The card guide as claimed in claim 2 in which each of said midportions are V-shaped midportions whereby said V-shaped midportions and their associated pair of leg portions form a W-shaped vibration dampener having two card-engaging surfaces on each vibration dampener.

4. The card guide as claimed in claim 3 in which each antivibration buffer comprises a pair of said vibration dampeners with the V-shaped midportions oppositely directed such as to form a pair of opposed W-shaped vibration dampeners having four card-engaging surfaces in each antivibration buffer.

5. A card guide for securing P.C. cards in a card rack comprising, an elongated base portion and a pair of elongated side walls forming a U-shaped channel of predetermined width, said predetermined width of said U-shaped channel being of substantially the same width as the thickness of the P.C. to be secured therein, at least two pairs of vibration dampeners spaced along the length of said guide, each of said vibration dampeners comprising a pair of flexible leg portions and an integral V-shaped midportion, said V-shaped midportions having card-engaging surfaces and being arranged in pairs facing each other and spaced apart by a distance less than that of said predetermined channel width whereby said card-engaging surfaces on said V-shaped midportions grip the P.C. card at spaced locations along the length of the guide in addition to the engagement of the P.C. card provided by said elongated side walls along the length of the card.

6. The card guide as claimed in claim 5 wherein opposite ends of each pair of leg portions are integral with one of said side walls whereby each of said vibration dampeners is W-shaped with two card-engaging surfaces.

7. The card guide as claimed in claim 6 comprising at least two pairs of said W-shaped vibration dampeners, said W-shaped vibration dampeners being arranged in pairs oppositely on each side of and spaced along said U-shaped channel whereby the P.C. card is engaged by a total of at least eight antivibration surfaces.

8. A plurality of the card guides as claimed in claim 1 wherein the diverging wall portions, forming said antivibration buffers with the enlarged spaces and having outer widths substantially wider than the outer width of the side walls forming the uniform width of the U-shaped channel, are positioned at different relative positions along the lengths of the plurality of guides whereby, in use in a rack, two adjacent guides may be closely spaced despite the greater outer widths of the antivibration buffers.

* * * * *